US012250784B2

(12) United States Patent
Huang et al.

(10) Patent No.: US 12,250,784 B2
(45) Date of Patent: Mar. 11, 2025

(54) EQUIPMENT LOCKING DEVICE

(71) Applicant: Microsoft Technology Licensing, LLC, Redmond, WA (US)

(72) Inventors: Chia-Ching Huang, Taipei (TW); Kevin Buana, Taoyuan (TW); Anand Avinash Kulkarni, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/085,364

(22) Filed: Dec. 20, 2022

(65) Prior Publication Data

US 2024/0206100 A1    Jun. 20, 2024

(51) Int. Cl.
*H05K 7/14*    (2006.01)

(52) U.S. Cl.
CPC .................................. *H05K 7/1415* (2013.01)

(58) Field of Classification Search
CPC .. H05K 7/1411; H05K 7/1415; H05K 7/1409; H05K 7/1474; H05K 7/1488; H05K 7/1489; H05K 5/0208
See application file for complete search history.

(56) References Cited

U.S. PATENT DOCUMENTS

| | | | | | |
|---|---|---|---|---|---|
| 2,276,197 | A | * | 3/1942 | Houston | E05B 65/468 312/333 |
| 3,404,929 | A | * | 10/1968 | Wright | E05B 65/463 312/216 |
| 4,355,851 | A | * | 10/1982 | Slusser | E05B 65/463 312/220 |
| 4,821,145 | A | * | 4/1989 | Corfits | H05K 9/0062 174/383 |
| 5,045,960 | A | * | 9/1991 | Eding | G11B 33/02 360/99.15 |
| 5,262,923 | A | * | 11/1993 | Batta | G06F 1/184 439/948 |
| 5,333,949 | A | * | 8/1994 | McGregor | E05B 65/464 312/221 |
| 5,510,955 | A | * | 4/1996 | Taesang | G11B 33/124 |
| 5,795,044 | A | * | 8/1998 | Trewhella, Jr. | A47B 88/57 292/87 |
| 6,099,098 | A | * | 8/2000 | Leong | G06F 1/183 |
| 6,246,576 | B1 | * | 6/2001 | Sands | G06F 1/183 361/679.02 |

(Continued)

FOREIGN PATENT DOCUMENTS

| | | | |
|---|---|---|---|
| CN | 202461047 U | 10/2012 | |
| CN | 112177461 A | 1/2021 | |
| TW | 202031108 A | * 8/2020 | ........... H05K 7/1489 |

OTHER PUBLICATIONS

International Search Report and Written Opinion received for PCT Application No. PCT/US23/081228, Apr. 4, 2024, 12 pages.

*Primary Examiner* — Patrick D Hawn
(74) *Attorney, Agent, or Firm* — RAY QUINNEY & NEBEKER P.C.; Paul N. Taylor

(57) ABSTRACT

A method and a device for locking an equipment with a rack are presented. The device may include a trigger and an equipment locking mechanism, wherein upon the trigger automatically activates the equipment locking mechanism upon contacting a portion of the rack. The automatic locking initiates when the equipment reaches a desired position within the rack.

20 Claims, 13 Drawing Sheets

(56) References Cited

U.S. PATENT DOCUMENTS

| | | | | |
|---|---|---|---|---|
| 6,313,985 B1* | 11/2001 | Chen | G06F 1/184 | 361/741 |
| 6,318,679 B1* | 11/2001 | Yang | G06F 1/187 | 248/27.3 |
| 6,373,707 B1* | 4/2002 | Hutchins | G06F 1/183 | 211/41.17 |
| 6,398,041 B1* | 6/2002 | Abbott | H05K 7/1489 | 361/829 |
| 6,547,289 B1* | 4/2003 | Greenheck | E05B 65/46 | 292/200 |
| 6,866,154 B2* | 3/2005 | Hartman | A47B 88/43 | 211/26 |
| 6,999,309 B2* | 2/2006 | Hsu | G06F 1/187 | 312/223.1 |
| 7,198,338 B2* | 4/2007 | Liu | A47B 67/04 | |
| 7,450,375 B2* | 11/2008 | Xu | G06F 1/184 | |
| 7,604,308 B2* | 10/2009 | Tseng | A47B 88/423 | 312/334.46 |
| 8,016,374 B2* | 9/2011 | Kropf | A47B 88/463 | 312/334.44 |
| 8,800,787 B2* | 8/2014 | Lohman | H05K 7/1415 | 361/829 |
| 8,905,497 B2* | 12/2014 | Bantle | A47B 88/463 | 312/319.1 |
| 9,253,915 B2* | 2/2016 | Mao | H05K 7/1411 | |
| 9,681,574 B1* | 6/2017 | Chen | H05K 7/1489 | |
| 9,861,196 B2* | 1/2018 | Chen | A47B 88/50 | |
| 10,117,350 B2* | 10/2018 | Kuang | H05K 7/1409 | |
| 10,136,547 B1* | 11/2018 | Cecire | H05K 7/20736 | |
| 10,321,599 B2* | 6/2019 | Chen | A47B 96/066 | |
| 10,646,040 B2* | 5/2020 | Chen | A47B 47/0058 | |
| 10,765,028 B1* | 9/2020 | Beall | H05K 7/1489 | |
| 11,406,031 B2* | 8/2022 | Yu | H05K 5/0221 | |
| 11,419,226 B1* | 8/2022 | Guduru | H05K 7/1489 | |
| 11,864,339 B2* | 1/2024 | An | H05K 5/0221 | |
| 2011/0211904 A1* | 9/2011 | Pirillis | H05K 7/1412 | 403/33 |
| 2016/0150659 A1* | 5/2016 | Chen | E05B 65/46 | 292/126 |
| 2016/0165761 A1* | 6/2016 | Cox | H05K 7/20272 | 211/26.2 |
| 2019/0052034 A1* | 2/2019 | Orris | H01R 25/142 | |
| 2021/0037671 A1* | 2/2021 | Ye | H05K 7/1415 | |
| 2021/0360807 A1* | 11/2021 | Yu | G06F 1/1679 | |
| 2023/0403812 A1* | 12/2023 | Cheung | H05K 7/1492 | |

\* cited by examiner

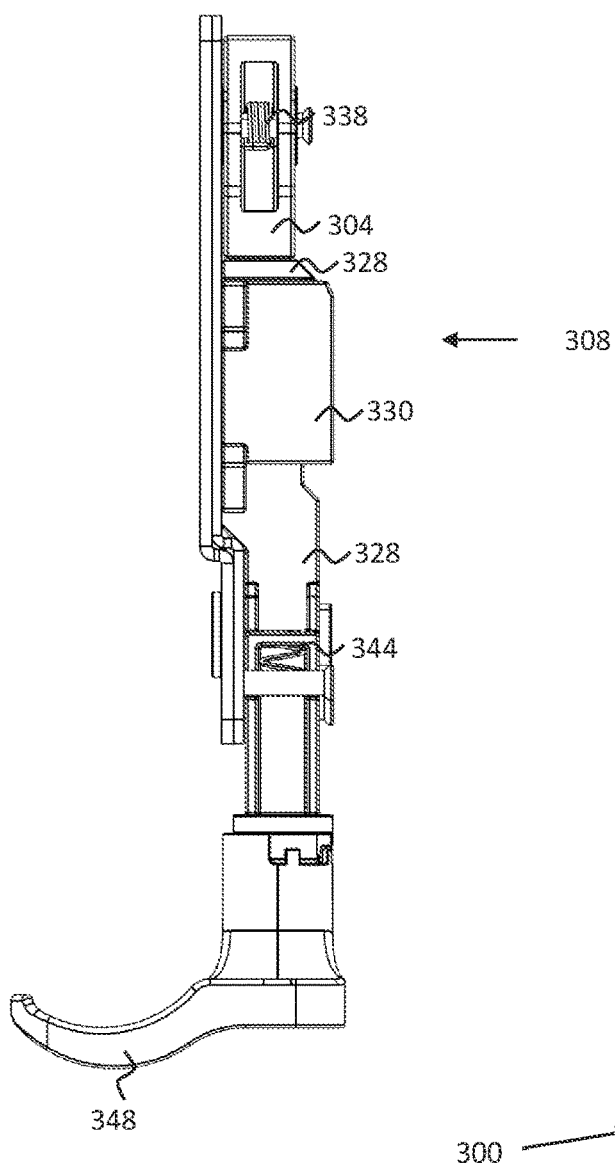
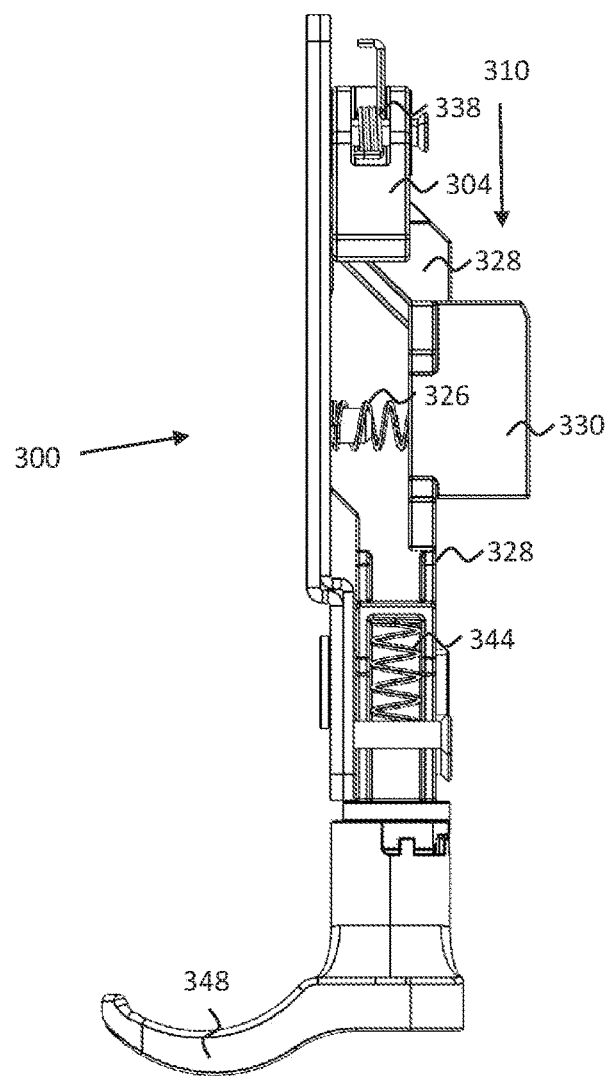
Fig. 3D-1
Fig. 3D-2

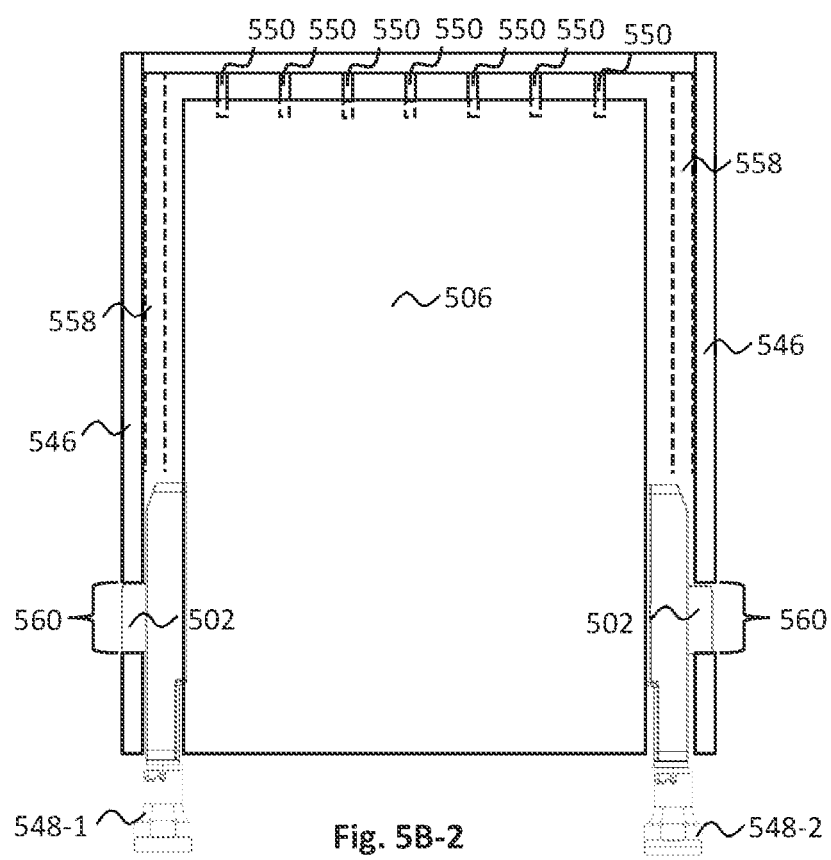

EQUIPMENT LOCKING DEVICE

BACKGROUND

One or more pieces of equipment, such as a server, storage device, router, switch, hub, or bridge, may be stored in a rack. Storing equipment in a rack may provide benefits such as connection to power, cooling systems, data connection, etc.

BRIEF SUMMARY

In some embodiments, an equipment locking device for locking an equipment within a rack is provided. The equipment locking device comprises an equipment locking mechanism connected to said equipment, wherein the equipment locking mechanism has an unlocked state and a locked state. The equipment locking device further comprises a trigger, wherein the trigger transitions between a set state and a tripped state. The trigger is connected to the equipment locking mechanism such that in the set state, the trigger retains the equipment locking mechanism in the unlocked state and such that as the trigger transitions from the set state to the tripped state, the trigger transitions the equipment locking mechanism from the unlocked state to the locked state upon contacting a portion of said rack.

In other embodiments, a method for locking equipment to a rack is provided. The method includes sliding the equipment inside the rack, and upon the equipment reaching a desired position within the rack, automatically locking the equipment to the rack.

In yet other embodiments, an equipment locking device for locking equipment within a rack is provided. The equipment locking device includes a rack locking mechanism, an equipment locking mechanism, and a trigger. The equipment locking mechanism having an unlocked state and a locked state. The trigger is connected to the equipment locking mechanism, such that upon the trigger contacting a portion of the rack, the trigger automatically transitions the equipment locking mechanism from the unlocked state to the locked state, wherein the equipment locking mechanism engages with the rack locking mechanism in the locked state.

This summary is provided to introduce a selection of concepts that are further described below in the detailed description. This summary is not intended to identify key or essential features of the claimed subject matter, nor is it intended to be used as an aid in limiting the scope of the claimed subject matter.

Additional features and advantages of embodiments of the disclosure will be set forth in the description which follows, and in part will be obvious from the description, or may be learned by the practice of such embodiments. The features and advantages of such embodiments may be realized and obtained by means of the instruments and combinations particularly pointed out in the appended claims. These and other features will become more fully apparent from the following description and appended claims, or may be learned by the practice of such embodiments as set forth hereinafter.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which:

FIGS. 3A-1, 3B-1, 3C-1, and 3D-1 represent an equipment locking device in an unlocked state and FIGS. 3A-2, 3B-2, 3C-2, and 3D-2 represent the equipment locking device from the same four angles as FIGS. 3A-1, 3B-1, 3C-1, and 3D-1 in a locked state, according to at least one embodiment.

FIGS. 5A-1 and 5B-1 represent an angled side view and FIGS. 5A-2 and 5B-2 represent a top-down view of an equipment locking device for locking equipment within a rack, according to at least one embodiment.

FIGS. 6A-1 and 6B-1 represent an angled side view and FIGS. 6A-2 and 6B-2 represent a top-down view of an equipment locking device for locking equipment within a rack, according to at least one embodiment.

DETAILED DESCRIPTION

Figure 1A:
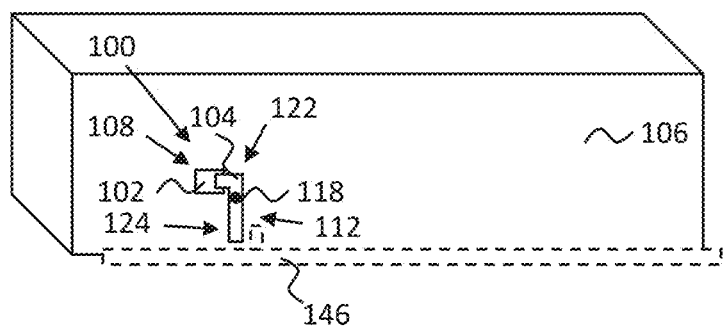
FIGS. 1A-1B represent an equipment locking device for locking equipment within a rack, according to at least one embodiment.

This disclosure generally relates to an equipment locking device for locking equipment within a rack. Currently, equipment, such as a server, storage device, router, switch, hub, or bridge, may be manually locked in a rack with a manual locking device. An example of a manual locking device may include a shark fin that will protrude from the locking device and into the rack. But one disadvantage of these shark fins is that if the equipment is not in the desired position inside the rack, the shark fins may damage cables connecting the equipment to things like power, cooling, and networking. Another disadvantage of these manual locking devices is that the user needs to manually lock and unlock them, which might easily lead to a situation where a user forgets to lock the equipment to the rack, or where the user forgets to unlock the equipment before pulling it out from the rack. Yet another disadvantage of these manual locking devices is that the user may push the equipment too deep inside the rack, which may damage the rack connectors and/or the equipment connectors, or the user may not push the equipment deep enough to connect the rack connectors to the equipment connectors.

Therefore, there is a need for an equipment locking device that prevents damaging cables during locking the equipment to the rack, during equipment servicing, or during extracting the equipment from the rack. Furthermore, there is a need for an equipment locking device that can automatically lock when the equipment has reached a desired location (e.g., depth, position, orientation) within the rack. Furthermore, there is a need for an equipment locking device that can prevent damaging the rack connectors and/or the equipment connectors and will provide an optimized connection between the rack connectors and the equipment connectors.

As illustrated in the foregoing discussion, the present disclosure utilizes a variety of terms to describe features and advantages of the systems herein. Additional detail is now provided regarding the meaning of some example terms.

For example, "equipment" generally refers to electronic equipment, such as a server, storage device, router, switch, hub, or bridge. In some embodiments, the equipment may be a physical computing device, such as a server, configured to implement, for instance, one or more virtual machines or other suitable virtualized components. In some embodiments, equipment may refer to a server device on a network of connected network devices (e.g., a cloud computing system).

A "rack" generally refers to a frame or enclosure for mounting and/or storing multiple equipment, such as servers. For example, racks are typically used by businesses and kept either in data centers or communication closets. Racks are typically tall structures that can hold many pieces of equipment in one location. Racks are typically made of strong metal, and they provide power, network, and other cables through these racks to the equipment mounted within. In some embodiments, racks may provide cooling for the equipment. For example, they may be designed to make airflow easy, they may include fans, or other cooling equipment, such as a liquid cooling cable. Racks typically include rails (also called guiderails) for mounting equipment within the rack.

Figure 1B:
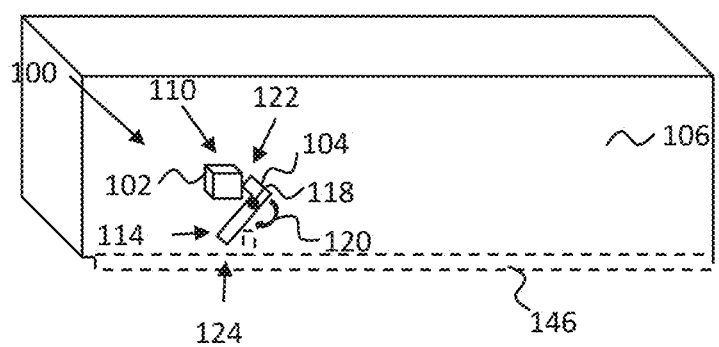

FIG. 1A-1B represent an equipment locking device 100 for locking equipment 106 within a rack, according to at least one embodiment. The equipment locking device 100 includes an equipment locking mechanism 102 and a trigger 104. The equipment locking mechanism 102 is connected to the equipment 106 and has an unlocked state 108 (FIG. 1A) and a locked state 110 (FIG. 1B). The trigger 104 is movable between a set state 112 (FIG. 1A) and a tripped state 114 (FIG. 1B). The trigger 104 is connected to the equipment locking mechanism 102 such that in the set state 112 the trigger 104 retains the equipment locking mechanism 102 in the unlocked state 108, as shown in FIG. 1A. The trigger 104 is further connected to the equipment locking mechanism 102 such that as the trigger transitions from the set state 112 to the tripped state 114, the trigger 104 transitions the equipment locking mechanism 102 from the unlocked state 108 (shown in FIG. 1A) to the locked state 110 (shown in FIG. 1B) upon contacting a portion of a rack 146. The trigger 104 and the equipment locking mechanism 102 are separate components, wherein the trigger 104 transitions the equipment locking mechanism 102 between the locked state 110 and the unlocked state 108.

In some embodiments, the equipment 106 to which the equipment locking mechanism 102 is connected to is a server. In some embodiments, the equipment 106 is a storage device. For example, the storage device may be a Hard Disk Drive (HDD), Solid State Drive (SSD), an optical storage device, or any other type of non-volatile storage device for storing data for long-or short-term retention, or a combination thereof. In another example, the storage device may include a memory device, such as ROM, RAM, DRAM, SRAM, or any other suitable volatile memory device for storing data temporarily. In some embodiments, the equipment 106 is one of a router, a switch, a hub, or a bridge.

In some embodiments, the equipment locking mechanism 102 is connected to a housing of the equipment 106. For example, in FIGS. 1A-1B the equipment locking mechanism 102 is connected to the side wall of the equipment 106. In another example, the equipment locking mechanism 102 may be connected to the top or bottom of the equipment 106. In some embodiments, there is one equipment locking mechanism connected to the equipment. In some embodiments, there are two or more equipment locking mechanisms connected to the equipment. For example, there may be one equipment locking mechanism on a right side of the equipment and one equipment locking mechanism on a left side of the equipment.

In some embodiments, the equipment locking mechanism 102 is biased towards the locked state 110 via a lock biasing member, as further discussed in connection to FIG. 3D-2. For example, the lock biasing member may be a spring, such as a compression spring, a conical spring, a disc spring, other springs, or combinations thereof. In FIG. 1A, the trigger 104 retains the equipment locking mechanism 102 in the unlocked state 108 by preventing the equipment locking mechanism 102 to bias away from the equipment. For example, the trigger 104 may be positioned on top of the equipment locking mechanism 102 to prevent the equipment locking mechanism 102 from transitioning from the unlocked state 108 to the locked state 110. In FIG. 1B, the trigger 104 is no longer retaining the equipment locking mechanism 102 in the unlocked state 108. Instead, the trigger 104 is not positioned on top of the equipment locking mechanism 102 but has moved to a tripped state 114 allowing the equipment locking mechanism 102 to bias away from the equipment 106 and into a locked state 110. In some embodiments, the trigger 104 rotates from the set state 112 to the tripped state 114 around an axis 118 as shown by an arrow 120 in FIG. 1B.

In some embodiments, the trigger 104 is biased towards the equipment locking mechanism 102 via a trigger biasing member. In some embodiments, the trigger may be rotationally biased via a trigger biasing member, as further discussed in connection to FIGS. 3A-1 through 3D-2. In some embodiments, the trigger may be biased perpendicularly against a rack, as further discussed in connection to FIGS. 6A-1 through 6B-2. For example, the trigger biasing member may be a spring, such as a torsion spring, coil spring, extension spring, compression spring, a conical spring, a disc spring, other springs, or combinations.

In some embodiments, the trigger 104 includes a first end 122 and a second end 124. In some embodiments, the first end of the trigger retains the equipment locking mechanism a in the locked state when the trigger is in the set state, as shown in FIG. 1A. In some embodiments, the second end of the trigger is configured to make a contact with a rack, as further discussed in connection with FIGS. 4A, 4B, 5A-1, 5B-1, 5A-2 and 5B-2. For example, the second end of the trigger may be configured to make a contact with a guiderail of the rack. In another example, the second end of the trigger may be configured to make a contact with a shelf of the rack. In yet another example, the second end of the trigger may be configured to make a contact with a sidewall of the rack. One possible benefit of allowing the second end of the trigger to make a contact with a rack is to automatically release the equipment locking mechanism from an unlocked state to a locked state at a particular location inside the rack, as further discussed in connection with FIGS. 4A, 4B, and 5A-2 through 5B-2.

In some embodiments, the trigger 104 is lined up parallel of the housing of the equipment 106 to which the equipment locking mechanism 102 is connected to, as shown in FIG. 1A-1B. One possible benefit of allowing the trigger to be lined up parallel of the housing of the equipment is to allow sidewalls of the rack, a shelf of the rack, or a guiderail of the rack to transition the equipment locking mechanism from an unlocked state to a locked state upon moving the trigger from a set state to a tripped state. Furthermore, it allows the equipment to be locked in various different portions of the rack. In some embodiments, the trigger is lined up perpendicular of the housing of the equipment to which the equipment locking mechanism is connected to, as further discussed in connection to FIGS. 2A-2B.

In some embodiments, as shown in FIGS. 1A-1B, the equipment locking mechanism 102 includes one component. In some embodiments, the equipment locking mechanism 102 includes two or more components, as further discussed in connection to FIGS. 3A-1 through 3D-2 and FIGS. 6A-1 through 6B-2. In some embodiments, the equipment locking mechanism includes an equipment locking mechanism housing, as further discussed in connection to FIGS. 5A-1 through 5B-2. In some embodiments the equipment locking mechanism is connected to the equipment via the equipment locking mechanism housing. For example, the equipment locking mechanism housing may be attached to the equipment housing via an adhesive, with screws, or by any other means to rigidly fix the equipment locking mechanism to the equipment.

Figure 2A:
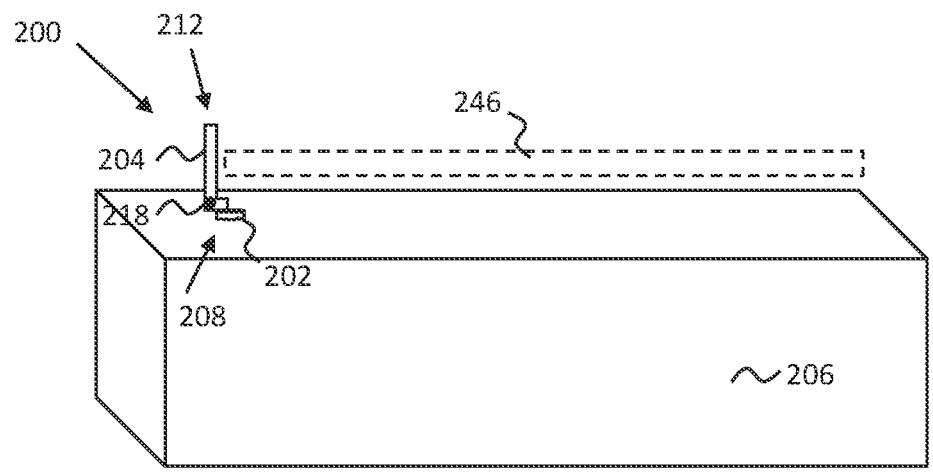
FIGS. 2A-2B represent an equipment locking device for locking equipment within a rack, according to at least one embodiment.
Figure 2B:
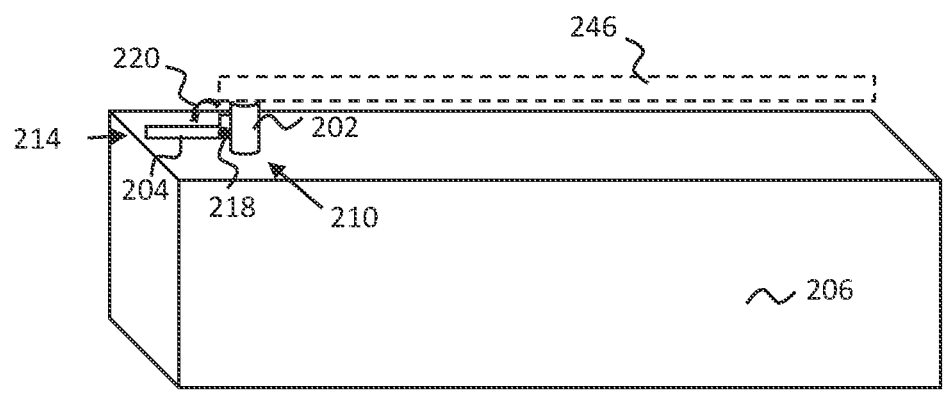

FIGS. 2A-2B represent an equipment locking device 200 for locking equipment 206 within a rack, according to at least one embodiment. The equipment locking device 200 includes an equipment locking mechanism 202 and a trigger 204. The equipment locking mechanism 202 is connected to the equipment 206 and has an unlocked state 208 (FIG. 2A) and a locked state 210 (FIG. 2B). The trigger 204 is movable between a set state 212 (FIG. 2A) and a tripped state 214 (FIG. 2B). The trigger 204 is connected to the equipment locking mechanism 202 such that in the set state 212, the trigger 204 retains the equipment locking mechanism 202 in the unlocked state 208, as shown in FIG. 2A. The trigger 204 is further connected to the equipment locking mechanism 202 such that as the trigger 204 transitions from the set state 112 to the tripped state 114, the trigger 204 transitions the equipment locking mechanism 202 from the unlocked state 208 (shown in FIG. 2A) to the locked state 210 (shown in FIG. 2B) upon contacting a portion of a rack 246.

The trigger 204, as shown in FIGS. 2A-2B, is lined up perpendicular of the housing of the equipment to which the equipment locking mechanism is connected to. One possible benefit of allowing the trigger to be lined up perpendicular of the housing of the equipment is to allow a top of the rack, a bottom of the rack, sidewalls of the rack, a shelf of the rack, or a guiderail of the rack to transition the equipment locking mechanism from an unlocked state to a locked state upon moving the trigger from a set state to a tripped state. Furthermore, it allows the equipment to be locked in various different portions of the rack.

In FIG. 2A, the trigger 204 retains the equipment locking mechanism 202 in the unlocked state 208 by preventing the equipment locking mechanism 202 to bias away from the equipment 206. For example, the trigger 204 may be positioned on top of the equipment locking mechanism 202 to prevent the equipment locking mechanism 202 to transition from the unlocked state 208 to the locked state 210. In FIG. 2B, the trigger 204 is no longer retaining the equipment locking mechanism 202 in the unlocked state 208. Instead, the trigger 204 is not positioned on top of the equipment locking mechanism 202 but has moved to the tripped state 214 allowing the equipment locking mechanism 202 to bias away from the equipment 206 and into a locked state 210. In some embodiments, the trigger 204 rotates from the set state 212 to the tripped state 214 around an axis 218, as shown by an arrow 220 in FIG. 2B.

FIGS. 3A-1, 3B-1, 3C-1, and 3D-1 represent an equipment locking device 300, such as the equipment locking device described in connection to FIGS. 1A and 1B, in an unlocked state 308 from four different angles, according to at least one embodiment. FIGS. 3A-2, 3B-2, 3C-2, and 3D-2 represent the same equipment locking device 300 from the same four angles as FIGS. 3A-1, 3B-1, 3C-1, and 3D-1 in a locked state 310, according to at least one embodiment.

Like the equipment locking device 100 in FIGS. 1A-1B, the equipment locking device 300 includes an equipment locking mechanism 302 and a trigger 304. The equipment locking mechanism 302 is connected to the equipment and has an unlocked state 308 and a locked state 310. The trigger 304 is movable between a set state 312 and a tripped state 314. The trigger 304 is connected to the equipment locking mechanism 302 such that in the set state 312, the trigger 304 retains the equipment locking mechanism 302 in the unlocked state 308. The trigger 304 is further connected to the equipment locking mechanism 302 such that as the trigger 304 transitions from the set state 312 to the tripped state 314, the trigger 304 transitions the equipment locking mechanism 302 from the unlocked state 308 to the locked state 310 upon contacting a portion of a rack 346 (shown on FIGS. 3A-1 and 3A-2).

Figures 1, 3A:
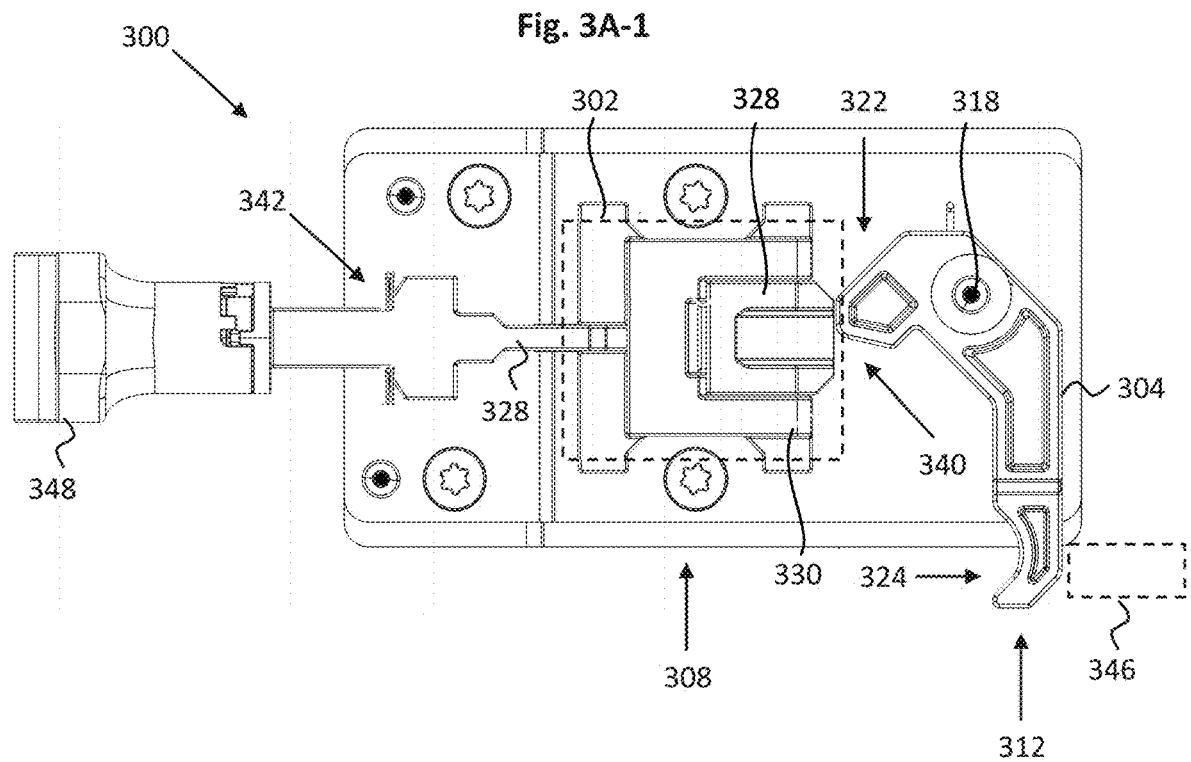
Figures 2, 3A:
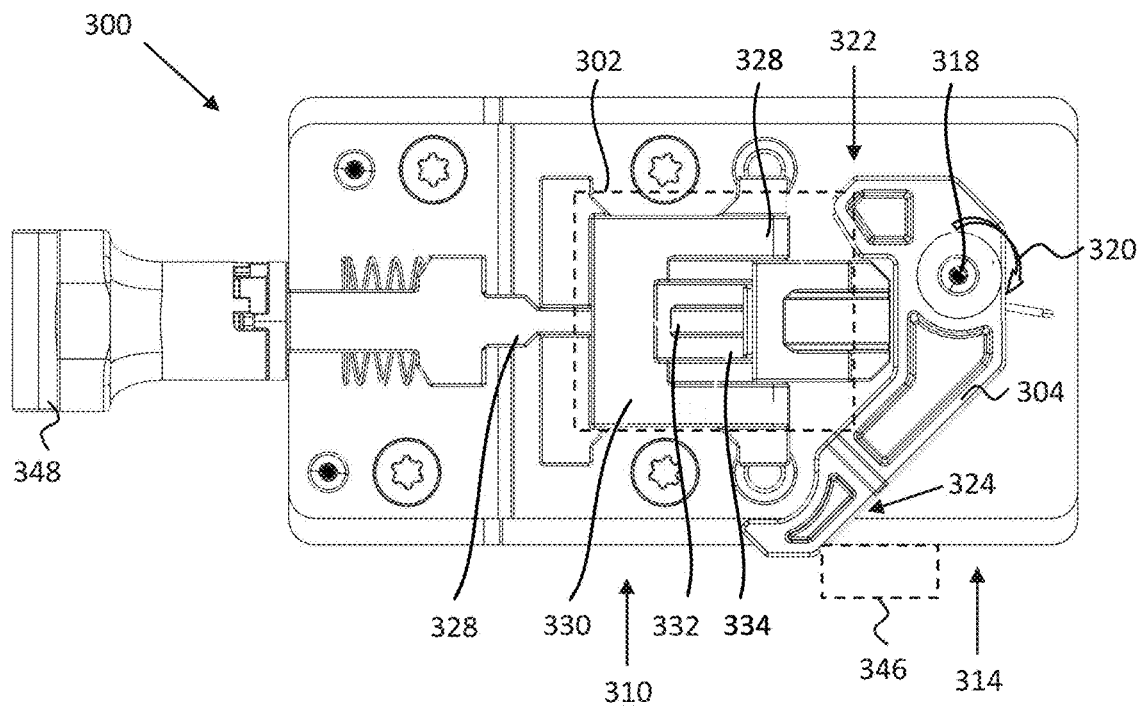
Figures 1, 3B:
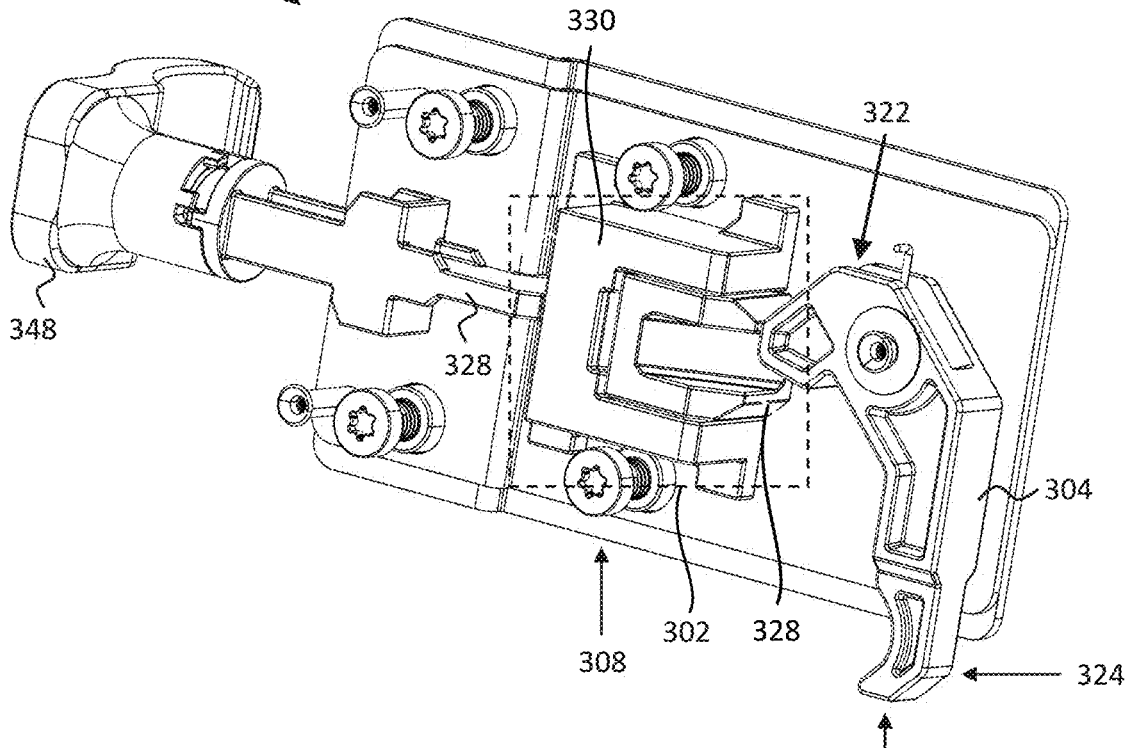
Figures 2, 3B:
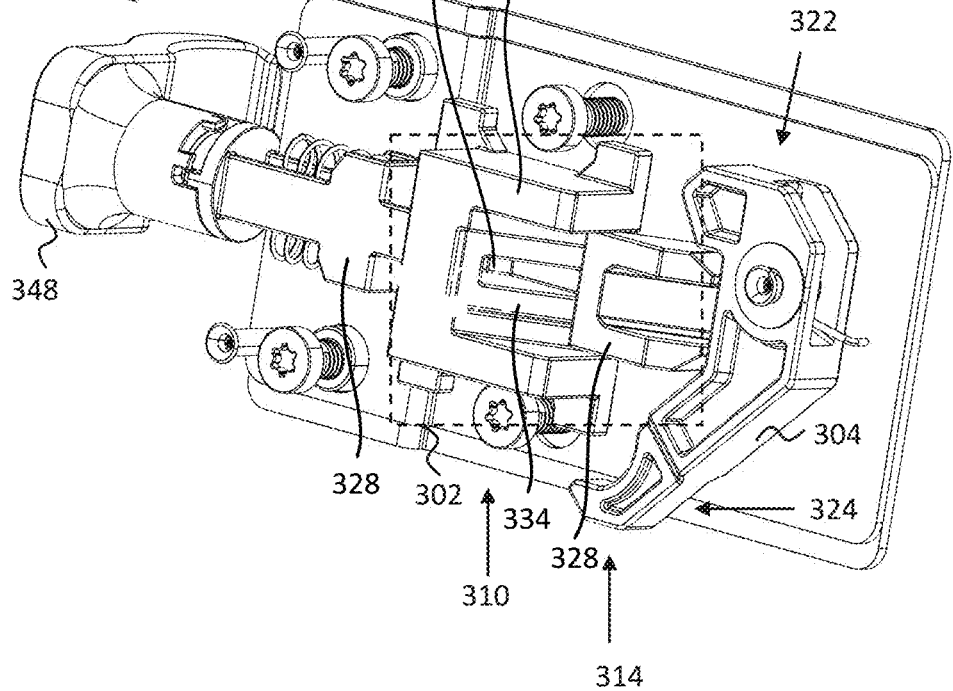
Figures 1, 3C:
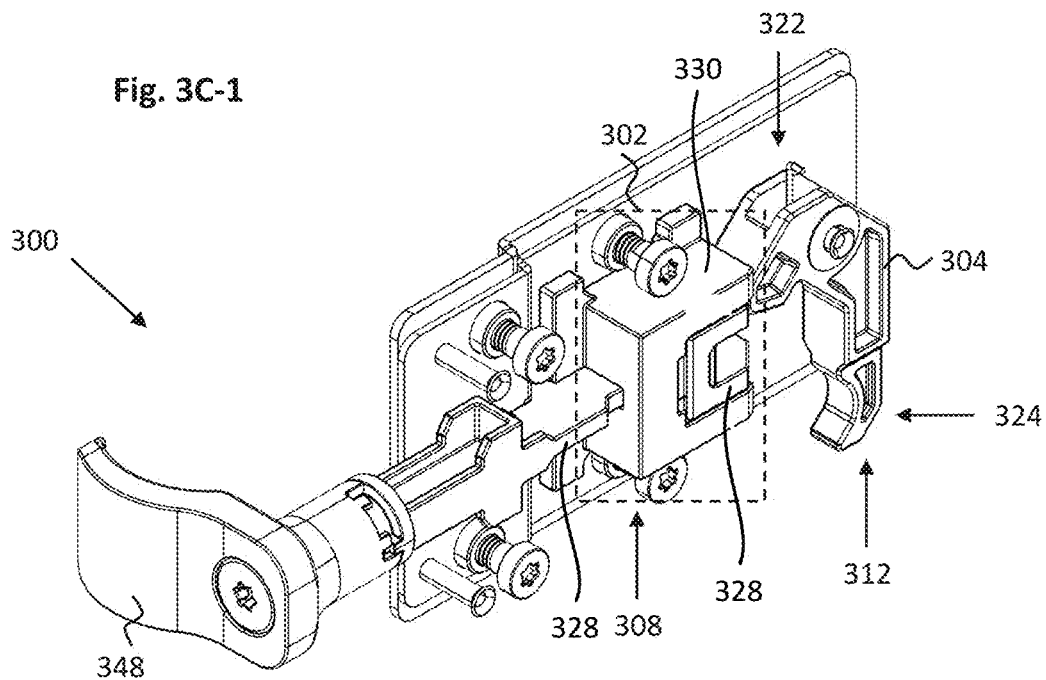
Figures 2, 3C:
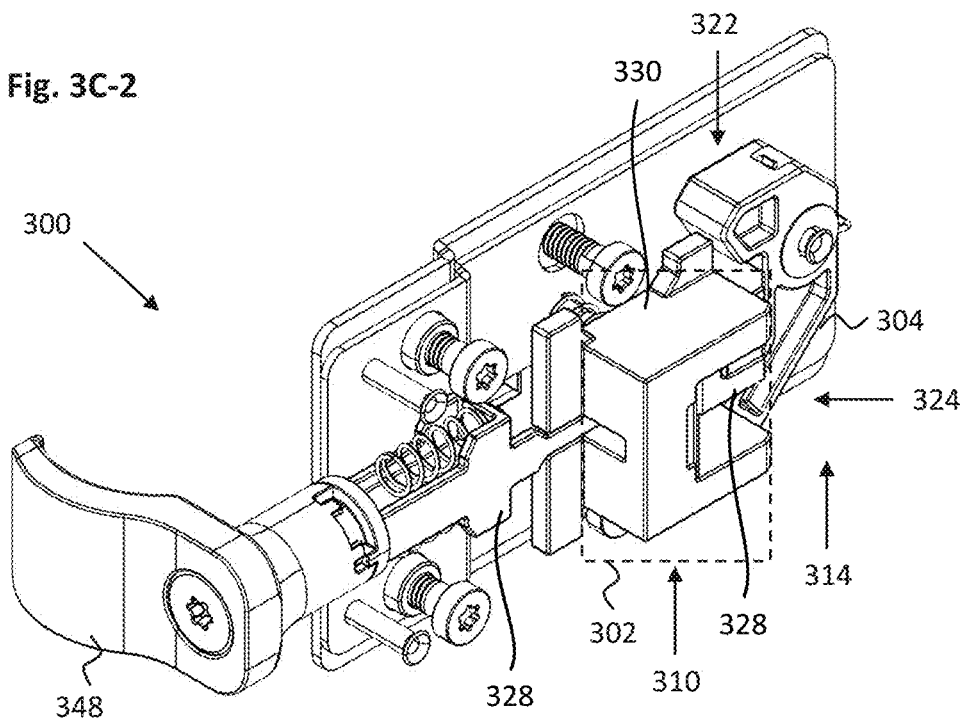

In FIGS. 3A-1 through 3D-2 the equipment locking mechanism 302 includes two components: a retraction bar 328 and an auto-ejector 330. In some embodiments, the equipment locking mechanism 302 is biased towards the locked state 310 via a lock biasing member 326, as shown in FIG. 3D-2. For example, the lock biasing member 326 may be a spring, such as a compression spring, a conical spring, a disc spring, other springs, or combinations. The auto-ejector 330 has an auto-ejector guiderail 332 in a wedge ramp 334 to guide the retraction bar 328 to wedge inside the auto-ejector 330 when moving from a locked state 310 to an unlocked state 308. In doing so, the retraction bar 328 pulls the auto-ejector 330 into an unlocked state 308.

In some embodiments, the retraction bar 328 is biased towards the trigger 304 via a retraction bar biasing member 344, as shown in FIGS. 3D-1 and 3D-2. For example, the retraction bar biasing member 344 may be a spring, such as a torsion spring, a coil spring, an extension spring, a compression spring, a conical spring, a disc spring, other springs, or combinations.

In some embodiments, the trigger 304 is biased towards the equipment locking mechanism 302 via a trigger biasing member 338, as shown in FIGS. 3D-1 and 3D-2. For example, the trigger biasing member may be a spring, such as a torsion spring coil spring, extension spring, compression spring, a conical spring, a disc spring, other springs, or combinations. In some embodiments, the trigger 304 is rotationally biased and rotates from the set state 312 to the tripped state 314 around an axis 318, as shown by an arrow 320 in FIG. 3A-2.

In some embodiments, the trigger 304 includes a first end 322 and a second end 324. In some embodiments, the first end 322 of the trigger 304 retains the retraction bar 328 wedged in with the auto-ejector 330, as shown in FIGS. 3A-1, 3B-1, 3C-1, and 3D-1, when the equipment locking mechanism 302 is in the unlocked state 308 and the trigger 304 is in the set state 312. In FIG. 3A-1, the trigger 304 prevents the retraction bar 328 from moving further to the right and to release the auto-ejector 330.

In some embodiments, the retraction bar 328 is movably connected to the auto-ejector 330 such that when the trigger 304 is in a set state 312, the trigger 304 prevents the retraction bar 328 from moving, and when the trigger 304 is in a tripped state 314, the retraction bar 328 has moved away from the auto-ejector 330 and allowed the auto-ejector 330 to move into the locked state 310, as shown in FIGS. 3A-2, 3B-2, 3C-2 and 3D-2.

In some embodiments, the second end 324 of the trigger 304 is configured to make a contact with a rack 346, as shown on FIGS. 3A-1 and 3A-2. For example, the second end 324 of the trigger 304 may be configured to make a contact with a guiderail of the rack 346, as further discussed in connection to FIGS. 5A-1, 5B-1, 5A-2, and 5B-2. In another example, the second end 324 of the trigger 304 may be configured to make a contact with a shelf of the rack 346, as further discussed in connection to FIGS. 4A and 4B. In yet another example, the second end 324 of the trigger 304 may be configured to make a contact with a sidewall of the rack 346. One possible benefit of allowing the second end of the trigger to make a contact with a rack is to automatically release the equipment locking mechanism from an unlocked state to a locked state at a particular location inside the rack, as further discussed in connection with FIGS. 4A, 4B, and 5A-1 through 5B-2.

In some embodiments, the retraction bar 328 further includes a first end 340 and a second end 342. In some embodiments, the first end 340 of the retraction bar 328 is wedged inside the auto-ejector 330 when the equipment locking mechanism 302 is in the unlocked state 308. In some embodiments, the second end 342 of the retraction bar 328 further includes a retraction bar biasing member 344, as discussed above.

In some embodiments, the second end of the retraction bar is connected to a handle 348 as further discussed in connection to FIGS. 5A-2 and 5B-2.

In some embodiments, the equipment to which the equipment locking mechanism is connected to is a server. In some embodiments, the equipment is a storage device. For example, the storage device may be an HDD, SSD, an optical storage device, or any other type of non-volatile storage device for storing data for long-or short-term retention, or a combination thereof. In another example, the storage device may include a memory device, such as ROM, RAM, DRAM, SRAM, or any other suitable volatile memory device for storing data temporarily. In some embodiments, the equipment is one of a router, a switch, a hub, or a bridge.

In some embodiments, there is one equipment locking mechanism connected to the equipment. In some embodiments, there are two or more equipment locking mechanisms connected to the equipment as further discussed in connection to FIGS. 5A-1 through 5B-2.

Figure 4A:
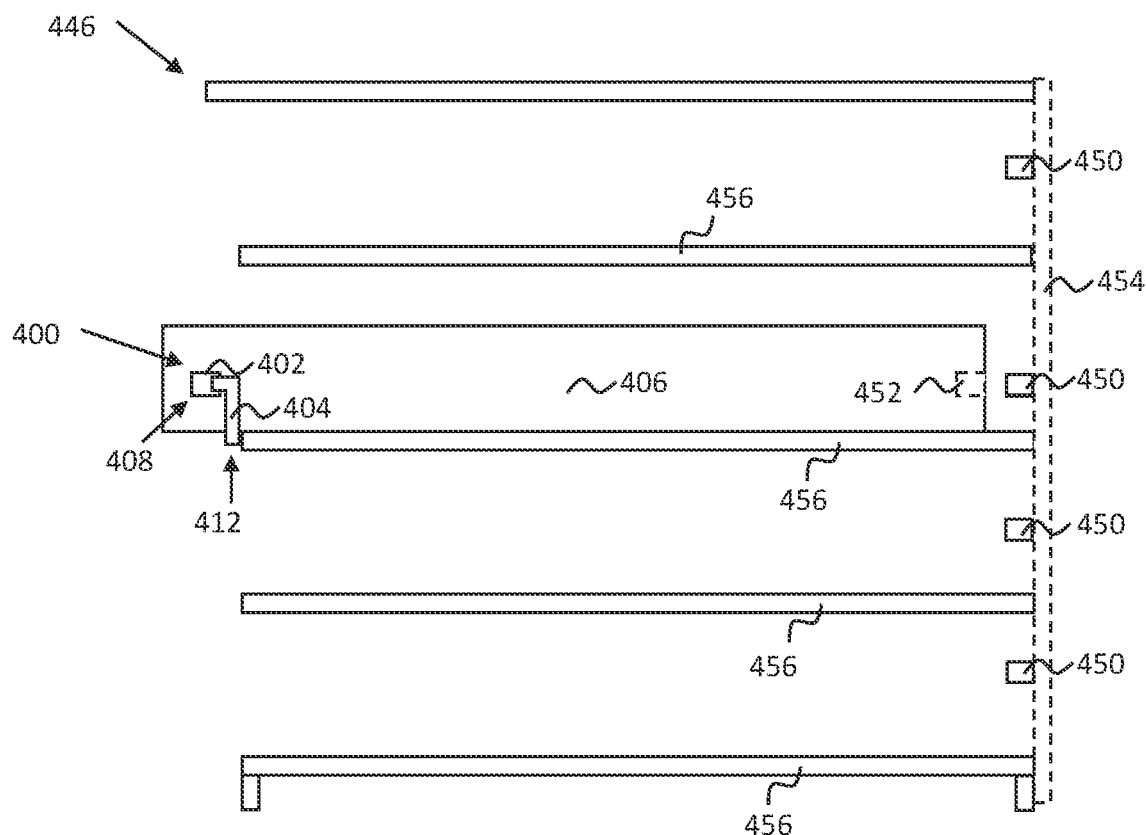
FIGS. 4A and 4B represent an equipment locking device for locking equipment within a rack, according to at least one embodiment.
Figure 4B:
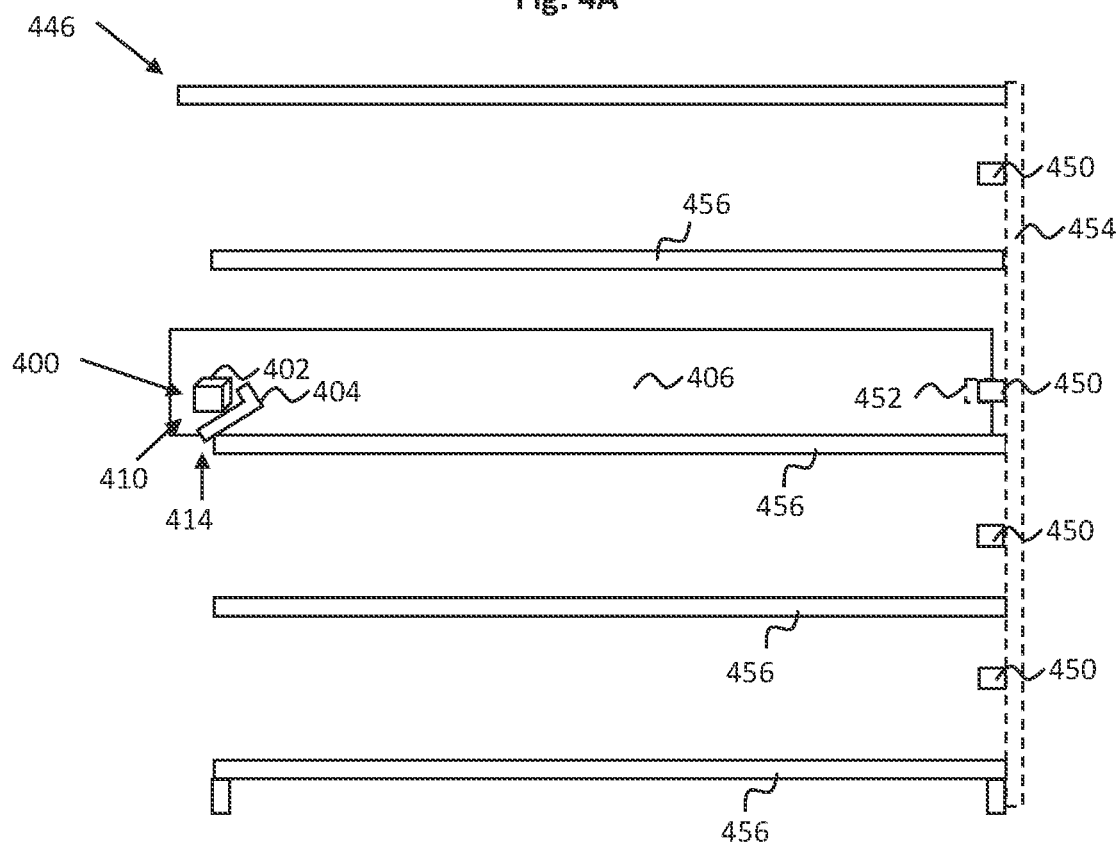

FIGS. 4A and 4B represent an equipment locking device 400 for locking equipment 406 within a rack 446, according to at least one embodiment. The equipment locking device 400, such as the equipment locking device 100 in FIGS. 1A and 1B, includes an equipment locking mechanism 402 and a trigger 404. The equipment locking mechanism 402 is connected to the equipment 406 and has an unlocked state 408 (FIG. 4A) and a locked state 410 (FIG. 4B). The trigger 404 is movable between a set state 412 (FIG. 4A) and a tripped state 414 (FIG. 4B). The trigger 404 is connected to the equipment locking mechanism 402 such that in the set state 412, the trigger 404 retains the equipment locking mechanism 402 in the unlocked state 408, as shown in FIG. 4A. The trigger 404 is further connected to the equipment locking mechanism 402 such that as the trigger transitions from the set state 412 to the tripped state 414, the trigger 404 transitions the equipment locking mechanism 402 from the unlocked state 408 (shown in FIG. 4A) to the locked state 410 (shown in FIG. 4B) upon contacting a portion of the rack 446.

In some embodiments, the rack 446 includes four shelves 456 and a vertical cabling bar 454, as shown in FIGS. 4A and 4B. In some embodiments, the rack 446 further includes a rack connector 450 connected to the cabling bar 454. In some embodiments, the equipment 406 includes an equipment connector 452 to accommodate the rack connector 450. For example, the rack connector may be a power connector, a cooling connector, an ethernet connector, a USB connector, a bus connector, or any other type of connector for providing cooling or connectivity to other equipment or to the Internet. In FIGS. 4A and 4B the rack connector 450 is a male connector and the equipment connector is a female connector. In some embodiments, the rack connector 450 is a female connector and the equipment connector is a male connector. In some embodiments, there may be more than one rack connectors and more than one equipment connectors.

In some embodiments, when the trigger 404 contacts a portion of the shelf 456, the trigger 404 transitions from the set state 412 to the tripped state 414 and transitions the equipment locking mechanism 402 from the unlocked state 408 to the locked state 410, as shown in FIGS. 4A and 4B. One possible benefit of having the equipment locking mechanism to automatically transition from the unlocked state to the locked state upon contacting a portion of a rack is that the timing and location for locking the equipment to the rack will be precise. This may allow the equipment to perfectly connect with one or more rack connectors 450 included in the rack 446. For example, a perfect connection is one where the rack connector 450 is fully inserted to the equipment connector 452 without being overly forced. In another example, a perfect connection is one where the equipment connector 452 is fully inserted to the rack connector 450 without being overly forced. Another possible benefit of perfect connection with one or more rack connectors 450 is that by locking the equipment 406 at the correct location, the user is unable to over push the equipment 406 inside the rack 446, which might damage one or more of the connectors 450 and the equipment 406 itself.

Figures 1, 5A:
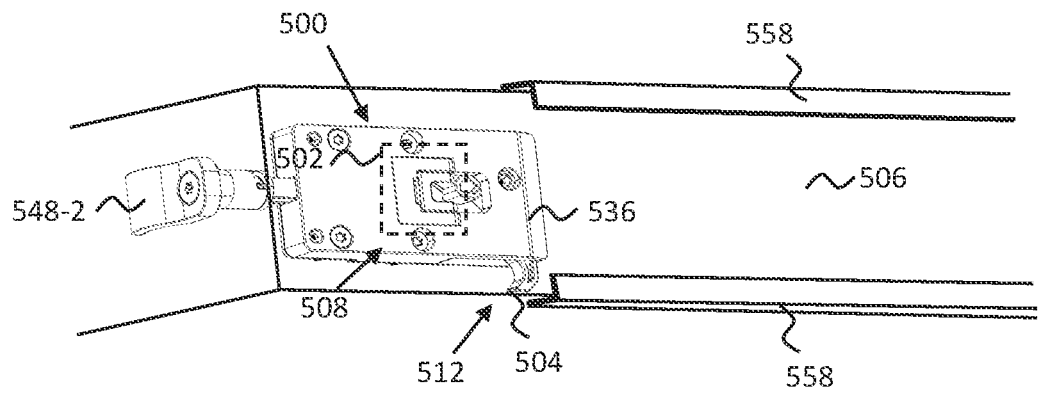
Figures 1, 5B:
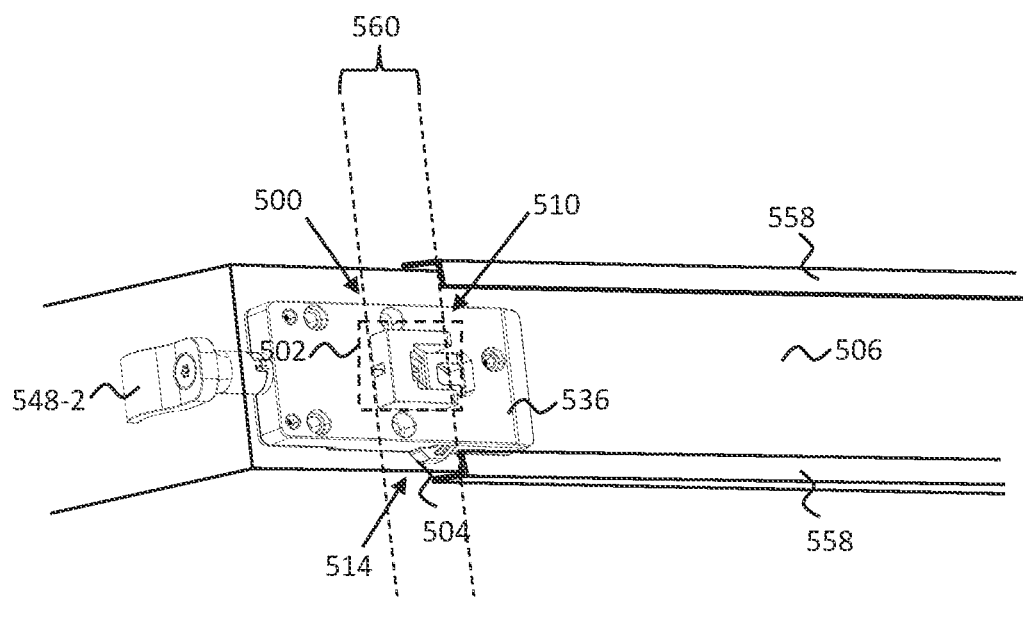
Figures 2, 5A:
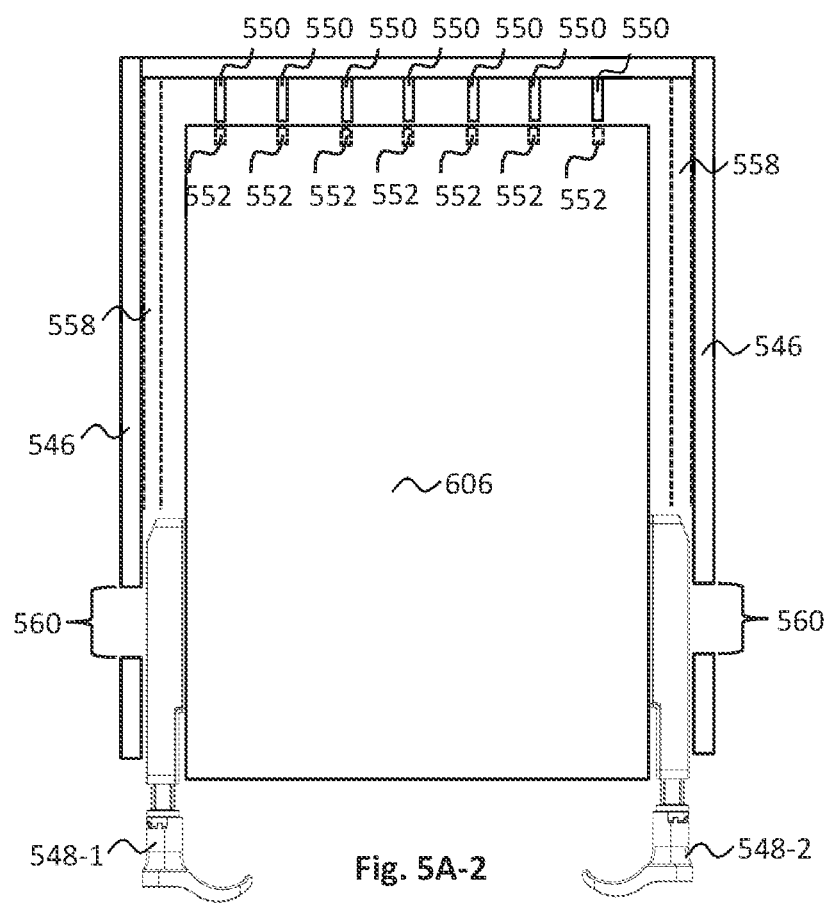

FIGS. 5A-1 and 5B-1 represent an angled side view of an equipment locking device 500 for locking equipment 506 within a rack 546, according to at least one embodiment. FIGS. 5A-2, and 5B-2 represent a top-down view of an equipment locking device 500 for locking equipment 506 within a rack 546, according to at least one embodiment. The equipment locking device 500, such as the equipment locking device 300 in FIGS. 3A-1-3D-2, includes an equipment locking mechanism 502 and a trigger 504. The equipment locking mechanism 502 is connected to the equipment 506 and has an unlocked state 508 (FIGS. 5A-1 and 5A-2) and a locked state 510 (FIGS. 5B-1 and 5B-2). The trigger 504 is movable between a set state 512 (FIG. 5A-1) and a tripped state 514 (FIG. 5B-1). The trigger 504 is connected to the equipment locking mechanism 502 such that in the set state 512, the trigger 504 retains the equipment locking mechanism 502 in the unlocked state 508, as shown in FIGS. 5A-1 and 5A-2. The trigger 504 is further connected to the equipment locking mechanism 502 such that as the trigger 504 transitions from the set state 512 to the tripped state 514, the trigger 504 transitions the equipment locking mechanism 502 from the unlocked state 508 (shown in FIGS. 5A-1 and 5A-2) to the locked state 510 (shown in FIGS. 5B-1 and 5B-2) upon contacting a portion of the rack 546 (shown on FIGS. 5A-2 and 5B-2). The equipment 506 in FIGS. 5A-1, 5B-1, 5A-2, and 5B-2 includes two locking devices, one on each side of the equipment 506.

In some embodiments, the rack 546 includes two guiderails 558 and one or more rack connectors 550, as shown in FIGS. 5A-2 and 5B-2. In some embodiments, the equipment 506 includes one or more equipment connectors 552 to accommodate the rack connector 550. For example, the one or more rack connectors and the one or more equipment connectors may be a power connector, cooling connector, an ethernet connector, a USB connector, a bus connector, or any other type of connector for providing cooling or connectivity to other equipment or to the Internet. In FIGS. 5A-2 and 5B-2 the rack 546 includes seven rack connectors 550 for the equipment 506. In some embodiments, the rack may include less than seven rack connectors. In some embodiments, the rack may include more than seven rack connectors. One possible benefit of having the equipment locking mechanism 502 to automatically transition from the unlocked state 508 to the locked state 510 upon contacting a portion of a rack 546 is that the timing and location for locking the equipment to the rack will be precise. This may allow the equipment to perfectly connect one or more equipment connectors 552 with one or more rack connectors 550. For example, a perfect connection is one where the rack connector 550 is fully inserted to the equipment connector 552 without being overly forced. In another example, a perfect connection is one where the equipment connector 552 is fully inserted to the rack connector 550 without being overly forced. Another possible benefit of perfect connection with one or more rack connectors 550 is that by locking the equipment 506 at the correct location, the user is unable to over push the equipment 506 inside the rack 546, which might damage one or more of the rack connectors 550 and/or the equipment connectors 552, and the equipment 506 itself.

In some embodiments, the rack 546 includes one or more rack apertures 560 to accommodate the equipment locking mechanism 502, as shown in FIG. 5B-2. One possible benefit of having the rack aperture 560 is to prevent the equipment 506 from being moved in any direction after the equipment locking mechanism 502 has transitioned from the unlocked state 508 to the locked state 510, as the equipment locking mechanism 502 fills the rack aperture 560, as shown in FIGS. 5B-1 and 5B-2.

In some embodiments, the equipment locking mechanism 502 includes two components: a retraction bar and an auto-ejector, such as the retraction bar 328 and the auto-ejector 330 of FIGS. 3A-1 through 3D-2. Similarly, as discussed in connection to FIGS. 3A-1 through 3D-2, the retraction bar may include a first end and a second end, wherein the second end of the retraction bar is connected to a handle, such as the handle 548-1 or 548-2. In some embodiments, the handle 548-1 and 548-2 is used to move the trigger 504 from the tripped state 514 back to the set state 512. For example, pulling the handles 548-1 and 548-2 may wedge the retraction bar back inside the auto-ejector which will allow the trigger 504 to rotate from the tripped state 514 to the set state 512. In some embodiments, the handle 548-1 and 548-2 is used to pull the equipment 506 out from the rack 546. In some embodiments, the handle 548-1 and 548-2 is used for both moving the trigger 504 from the tripped state 514 to the set state 512 and to pull the equipment 506 out from the rack 546. One possible benefit of allowing to pull the handle is to easily remove the equipment from the rack and to activate the trigger at the same time for easy reinsertion. Another possible benefit of allowing to pull the handle is to translate the equipment locking mechanism from a lock state to an unlocked state automatically so that the auto-ejector won't damage any cables, or the rack itself when pulling the equipment out from the rack.

In some embodiments, the handle 548-1 and 548-1 is rotatable, e.g., the handle 548-1 and 548-2 may be turned counterclockwise or clockwise. For example, the handle may the turned by 90 degrees counterclockwise or clockwise. In FIG. 5B-2, the handle 548-1 has been rotated approximately 90 degrees clockwise from the handle position shown in FIG. 5A-2, while the handle 548-2 has been rotated approximately 90 degrees counterclockwise from the handle position shown in FIG. 5A-2. In another example, the handle may be turned 180 degrees counterclockwise or clockwise. In yet another example, the handle 548-1 and 548-2 may be turned more than 180 degrees counterclockwise or clockwise. In further examples, the handle 548-1 or 548-2 may be turned less than 90 degrees counterclockwise or clockwise. One possible benefit of having a rotatable handle is to allow the front of the equipment to be clear and accessible to a user, such as shown in FIG. 5B-2. Another possible benefit of having a rotatable handle is to prevent any damage to the rack (for example the sidebar of the rack) or to the user's hand when pulling the equipment out of the rack.

In some embodiments, the equipment locking mechanism 502 includes an equipment locking mechanism housing 536, as shown in FIGS. 5A-1 and 5B-1. In some embodiments, the equipment locking mechanism 502 is connected to the equipment 506 via the equipment locking mechanism housing 536. For example, the equipment locking mechanism housing 536 may be attached to the equipment 506 housing via an adhesive, with screws, or by any other means to rigidly fix the equipment locking mechanism 502 to the equipment 506. For example, the equipment locking mechanism housing 536 may be connected to the side wall of the equipment 506. In another example, the equipment locking mechanism housing 536 may be connected to the top or bottom of the equipment 506.

In some embodiments, there is one equipment locking mechanism connected to the equipment. In some embodiments, there are two or more equipment locking mechanisms connected to the equipment. For example, there may be one equipment locking mechanism on a right side of the equipment and one equipment locking mechanism on a left side of the equipment, as shown in FIGS. 5A-1 and 5B-1.

Figures 1, 6A:
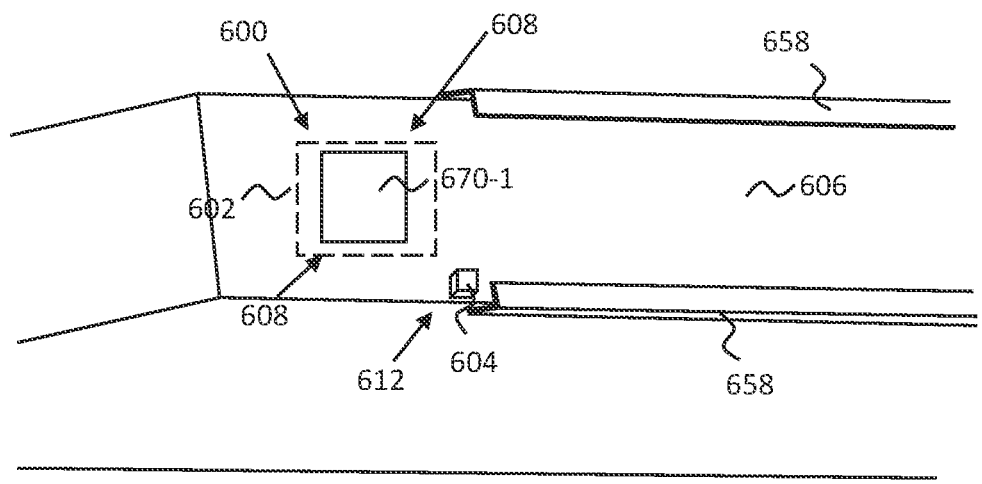
Figures 1, 6B:
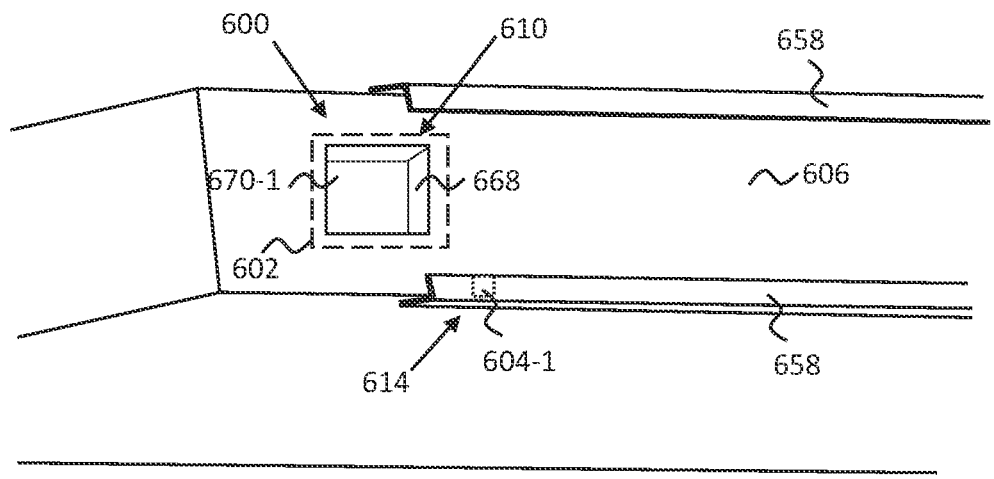
Figures 2, 6A:
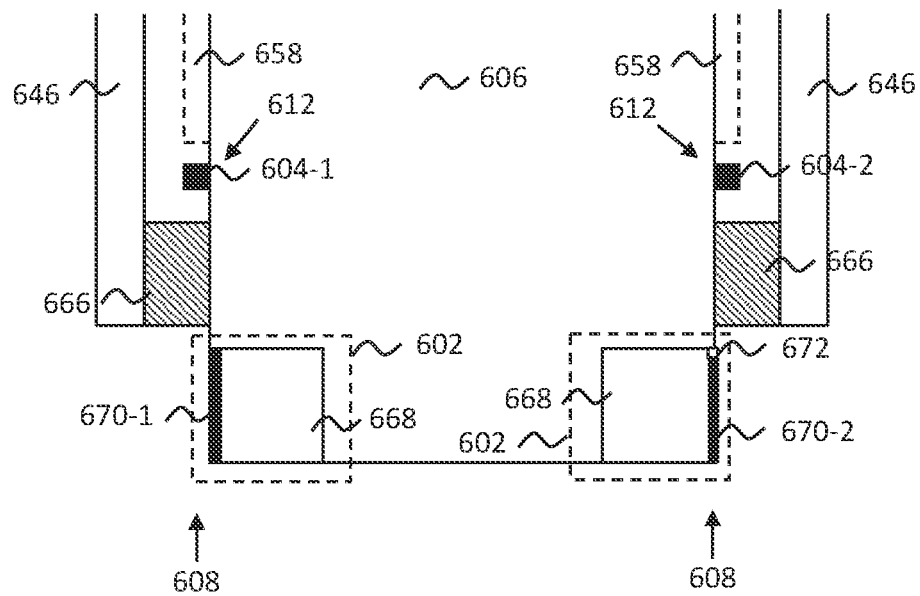
Figures 2, 6B:
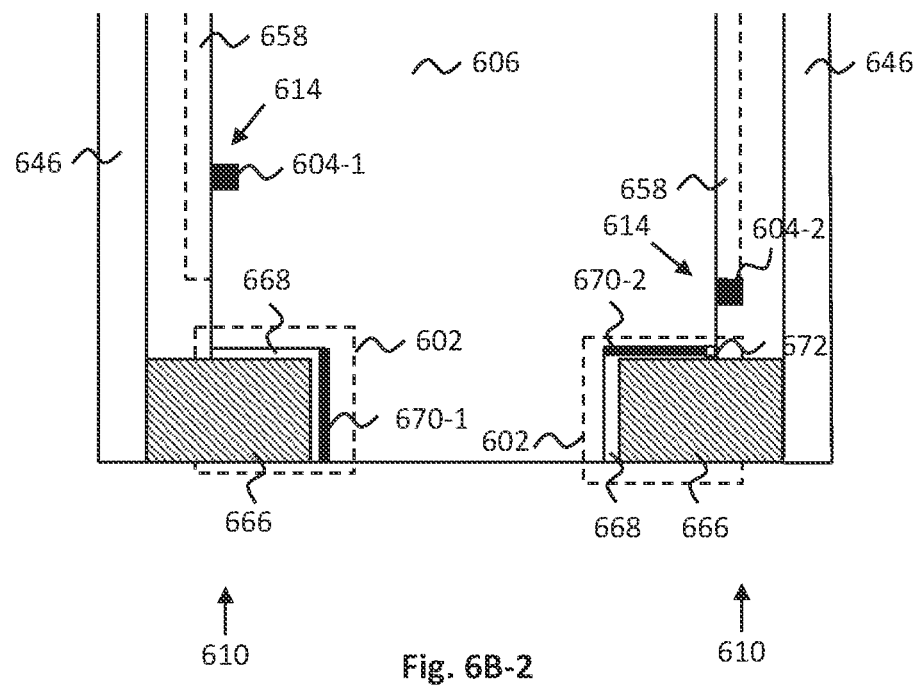

FIGS. 6A-1 and 6B-1 represent an angled side view and FIGS. 6A-2, and 6B-2 represent a top-down view of an equipment locking device 600 for locking equipment 606 within a rack 646, according to at least one embodiment. The equipment locking device 600 includes a rack locking mechanism 666, an equipment locking mechanism 602, and a trigger 604-1 and 604-2. The equipment locking mechanism 602 has an unlocked state 608 (FIGS. 6A-1 and 6A-2) and a locked state 610 (FIGS. 6B-1 and 6B-2). The trigger 604-1 and 604-2 is connected to the equipment locking mechanism 602 such that upon the trigger 604-1 or 604-2 contacting a portion of the rack 646, the trigger 604-1 and 604-2 automatically transitions the equipment locking mechanism 602 from the unlocked state 608 to the locked state 610, wherein the equipment locking mechanism 602 in the locked state 610 engages with the rack locking mechanism 666.

The trigger 604-1 and 604-2 is movable between a set state 612 and a tripped state 614. The trigger 604-1 and 604-2 is connected to the equipment locking mechanism 602 such that in the set state 612, the trigger 604 retains the equipment locking mechanism 602 in the unlocked state 608. The trigger 604-1 and 604-2 is further connected to the equipment locking mechanism 602 such that as the trigger 604-1 and 604-2 transitions from the set state 612 to the tripped state 614, the trigger 604-1 and 604-2 transitions the equipment locking mechanism 602 from the unlocked state 608 (shown in FIGS. 6A-1 and 6A-2) to the locked state 610 (shown in FIGS. 6B-1 and 6B-2) upon contacting a portion of the rack 646.

In the embodiment shown in FIGS. 6A-1, 6B-1, 6A-2 and 6B-2, there is one equipment locking device on the right side of the equipment 606, and one equipment locking device on the left side of the equipment 606. The triggers 604-1 and 604-2 are protruding out of the equipment 606 when the triggers 604-1 and 604-2 are in a set state 612. In the embodiment shown in FIGS. 6A-1, 6B-1, 6A-2 and 6B-2, the trigger 604-1 is biased away from the housing of the equipment 606 via a trigger biasing member. The trigger 604-2 on the other hand does not have a biasing member but is a rigid protrusion.

Upon contacting a portion of the rack 646, such as the guiderail 658 shown in FIGS. 6A-1, 6B-1, 6A-2 and 6B-2, the triggers 604-1 and 604-2 transition from the set state 612 to the tripped state 614. In the embodiment shown in FIGS. 6B-1 and 6B-2, the trigger 604-1 is pushed inside the equipment 606 when transitioning to the tripped state 614. In some embodiments, the trigger 604 may get pushed against the outer surface of the equipment 606 when transitioning to the tripped state. In the embodiment shown in FIG. 6B-1, the trigger 604-2 gets pushed by the guiderail 658 sideways along the equipment 606 surface when transitioning to the tripped state 614.

In the embodiment shown in FIGS. 6A-1, 6B-1, 6A-2, and 6B-2, the equipment locking mechanism 602 includes a passage 668 and a passage cover 670-1 or 670-2. The passage cover 670-1 and 670-2 is positioned at the passage 668 opening when the equipment locking mechanism 602 is in the unlocked state 608 and the trigger 604-1 and 604-2 is in the set state 612. When the trigger 604-1 and 604-2 transitions from the set state 612 to the tripped state 614, the trigger 604-1 and 604-2 moves the passage cover 670-1 and 670-2 away from the passage 668 opening revealing the passage 668, and transitions the equipment locking mechanism 602 to the locked state 610. In some embodiments, the trigger 604-1 and 604-2 is connected via a switch to the passage cover 670-1 and 670-2. For example, pushing or moving the trigger may activate a switch that moves the passage cover. In some embodiments, the trigger 604-1 and 604-2 is electronically connected to the passage cover 670-1 and 670-2. For example, pushing or moving the trigger may create an electrical signal to a processor, wherein the processor provides instructions for the passage cover to move the cover away from the passage opening. In some embodiments, the trigger 604-1 and 604-2 is magnetically connected to the passage cover 670-1 and 670-2. For example, pushing or moving the trigger may create a magnetic force, wherein the magnetic force moves the passage cover away from the passage opening. In some embodiments, the trigger 604-1 and 604-2 is mechanically coupled with the passage cover 670-1 and 670-2. For example, pushing or moving the trigger may push or move the passage cover away from the passage opening. In some embodiments, the trigger 604-1 and 604-2 is wirelessly connected to the passage cover 670-1 and 670-2. For example, the trigger may wirelessly indicate the passage cover to move away from the passage opening.

In the embodiment shown in FIGS. 6A-1, 6B-1, 6A-2, and 6B-2, the trigger is positioned at the side surface of the equipment. In some embodiments, the trigger may be positioned at the back, top, or bottom of the equipment. For example, the trigger may transition from the set state to the triggered state by contacting a portion of the rack's back wall, shelf, top, or bottom walls.

In some embodiments, the passage cover 670-1 transitions from the top of the passage 668 opening to the bottom of the passage 668 e.g., inside the equipment 606, as shown in FIGS. 6A-1, 6B-1, 6A-2, and 6B-2. In some embodiments, the passage cover transitions from the top of the passage opening to the side of the opening. In some embodiments, as shown in FIG. 6B-2, the passage cover 670-2 transitions from the top of the passage 668 via a hinge 672 to the side wall of the passage 668.

In the embodiment shown in FIGS. 6A-2 and 6B-2, the equipment locking device further includes a rack locking mechanism 666 configured to engage with the equipment locking mechanism 602. In some embodiments, the rack locking mechanism 666 may be a rack auto-ejector that is biased towards the equipment 606 via a rack auto-ejector biasing member (e.g., a spring). When the equipment 606 reaches the desired location (e.g., depth, orientation, position) inside the rack 646, and the passage cover 670-1 and 670-2 opens, the rack locking mechanism 666 may engage with the passage 668, locking the equipment 606 to the rack 646.

In some embodiments, the rack 646 further includes one or more rack connectors and the equipment 606 includes one or more equipment connectors to accommodate the rack connector. For example, the rack connector may be a power connector, a cooling connector, an ethernet connector, a USB connector, a bus connector, or any other type of connector for providing cooling or connectivity to other equipment or to the Internet. In some embodiments, the one or more rack connectors are male connectors and the one or more equipment connectors are female connectors. In some embodiments, the one or more rack connectors are female connectors, and the one or more equipment connectors are male connectors. In some embodiments, when the one or more rack connectors are connected to the one or more equipment connectors, the trigger transitions from the set state to the tripped state and the trigger transitions the equipment locking mechanism from the unlocked state to the locked state.

Figure 7:
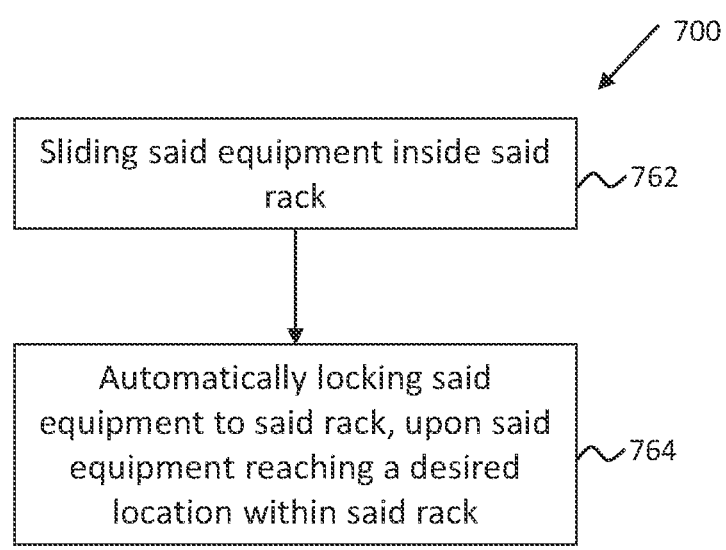
FIG. 7 represents a method for locking equipment to a rack, according to at least one embodiment.

FIG. 7 represents a method 700 for locking an equipment to a rack, according to at least one embodiment. The method 700 includes sliding the equipment inside the rack, at stage 762. In some embodiments, the equipment includes equipment connectors. For example, the equipment connectors may be located at the back side panel of the equipment. In some embodiments, the rack includes one or more rack connectors. For example, the one or more rack connectors may be located at the inside back wall of the rack. The one or more equipment connectors and the one or more rack connectors may be one or more of a power connector, cooling connector, an ethernet connector, a USB connector, and a sub connector. In some embodiments, the equipment is one of a server, a storage device, a router, a switch, a hub, or a bridge.

The method 700 further includes automatically locking the equipment to the rack upon the equipment reaching a desired location within the rack at stage 764. In some embodiments, the desired location is a desired depth inside the rack. For example, the desired depth may be such where one or more rack connectors connect with one or more equipment connectors. In some embodiments, the automatic locking takes place without user input. In some embodiments, the equipment is powered without readjusting the position of the equipment. In some embodiments, the equipment is cooled down without readjusting the position of the equipment. In some embodiments, the equipment is communicating with one or more of another equipment and the Internet without readjusting the position of the equipment. In some embodiments, the equipment is ready to be booted up without readjusting the position of the equipment.

In some embodiments the equipment is connected to an equipment locking mechanism and a trigger on an external surface of the equipment. In some embodiments, the equipment locking mechanism has an unlocked state and a locked state, and the trigger has a set state and a tripped state. In some embodiments, the trigger is connected to the equipment locking mechanism such that in the set state the trigger retains the equipment locking mechanism in the unlocked state and such that as the trigger transitions from the set state to the tripped state the trigger transitions the equipment locking mechanism from the unlocked state to the locked state at the desired location. In some embodiments, at the desired location, the trigger contacts a portion of the rack.

A1. An equipment locking device for locking equipment within a rack, comprising:
- an equipment locking mechanism connected to the equipment, the equipment locking mechanism having an unlocked state and a locked state; and
- a trigger transitioning between a set state and a tripped state, the trigger connected to the equipment locking mechanism such that in the set state, the trigger retains the equipment locking mechanism in the unlocked state and such that as the trigger transitions from the set state to the tripped state, the trigger transitions the equipment locking mechanism from the unlocked state to the locked state upon contacting a portion of the rack.

A2. The equipment locking device of section A1, wherein the equipment is one of a server, a storage device, a router, a switch, a hub, or a bridge.

A3. The equipment locking device of section A1, wherein the equipment locking mechanism is connected to a housing of the equipment.

A4. The equipment locking device of section A1, further including two or more equipment locking mechanisms connected to a housing of the equipment.

A5. The equipment locking device of section A1, wherein the equipment locking mechanism is biased towards the locked state via a lock biasing member.

A6. The equipment locking device of section A5, wherein the lock biasing member is a spring.

A7. The equipment locking device of section A1, wherein in the set state the trigger retains the equipment locking mechanism in the unlocked state further includes the trigger positioned on top of the equipment locking mechanism.

A8. The equipment locking device of section A1, wherein in the tripped state the trigger is no longer positioned on top of the equipment locking mechanism.

A9. The equipment locking device of section A1, further including the trigger rotating around an axis from the set state to the tripped state.

A10. The equipment locking device of section A1, wherein the trigger is biased towards the equipment locking mechanism via a trigger biasing member.

A11. The equipment locking device of section A10, wherein the trigger biasing member is a spring.

A12. The equipment locking device of section A11, wherein the spring is at least one of a torsion spring, a coil spring, an extension spring, and a compression spring.

A13. The equipment locking device of section A1, wherein the trigger has a first end and a second end.

A14. The equipment locking device of section A13, wherein the first end of the trigger retains the equipment locking mechanism in the unlocked state when the trigger is in the set state.

A15. The equipment locking device of section A13, wherein the second end of the trigger is configured to make a contact with the rack.

A16. The equipment locking device of section A15, wherein the second end of the trigger is configured to contact with a guiderail of the rack.

A17. The equipment locking device of section A15, wherein the second end of the trigger is configured to contact with a shelf of the rack.

A18. The equipment locking device of section A15, wherein the second end of the trigger is configured to contact with at least one of a sidewall, a top, and a bottom of the rack.

A19. The equipment locking device of section A3, wherein the trigger is lined up in parallel of the housing of the equipment.

A20. The equipment locking device of section A3, wherein the trigger is lined up in perpendicular of the housing of the equipment.

A21. The equipment locking device of section A1, wherein the equipment locking mechanism includes an equipment locking mechanism housing.

A22. The equipment locking device of section A21, wherein the equipment locking mechanism is connected to the equipment via the equipment locking mechanism housing.

A23. The equipment locking device of section A1, wherein the equipment locking mechanism further includes a retraction bar and an auto-ejector.

A24. The equipment locking device of section A23, wherein the auto-ejector includes a guide rail in a wedge ramp.

A25. The equipment locking device of section A24, wherein the guide rail guides the retraction bar to wedge inside the auto-ejector when moving from the locked state to the unlocked state.

A26. The equipment locking device of section A23, wherein the retraction bar is configured to pull the auto-ejector into the unlocked state.

A27. The equipment locking device of section A23, wherein the retraction bar is biased towards the trigger via a retraction bar biasing member.

A28. The equipment locking device of section A27, wherein the retraction bar biasing member is a spring.

A29. The equipment locking device of section A28, wherein the spring is at least one of a torsion spring, a coil spring, an extension spring, and a compression spring.

A30. The equipment locking device of section A23, wherein the retraction bar further includes a first end and a second end.

A31. The equipment locking device of section A30, wherein the first end of the retraction bar is wedged inside the auto-ejector when the equipment locking mechanism is in the unlocked state.

A32. The equipment locking device of section A30, wherein the second end of the retraction bar is connected to a handle.

A33. The equipment locking device of section A32, wherein the handle is pulled to move the trigger from the tripped state to the set state.

A34. The equipment locking device of section A33, further including wedging the retraction bar inside the auto-ejector.

A35. The equipment locking device of section A32, wherein the handle is pulled to move the equipment out from said rack.

A36. The equipment locking device of section A32, wherein the handle is rotatable.

A37. The equipment locking device of section A36, wherein the handle rotates 90 degrees clockwise and counterclockwise.

A38. The equipment locking device of section A36, wherein the handle rotates more than 90 degrees clockwise and counterclockwise.

A39. The equipment locking device of section A36, wherein the handle rotates less than 90 degrees clockwise and counterclockwise.

A40. The equipment locking device of section A1, wherein the rack includes one or more rack connectors.

A41. The equipment locking device of section A40, wherein the equipment includes one or more equipment connectors.

A42. The equipment locking device of section A41, wherein the one or more rack connectors are connected to the one or more equipment connectors when the trigger is transitioned from the set state to the tripped state and the trigger transitions the equipment locking mechanism from the unlocked state to the locked state.

A43. The equipment locking device of section A41, wherein the one or more rack connectors and the one or more equipment connectors are one or more of a power connector, cooling connector, an ethernet connector, a USB connector, and a bus connector.

B1. A method for locking an equipment to a rack, comprising:
sliding the equipment inside the rack; and
upon the equipment reaching a desired position within the rack, automatically locking the equipment to the rack.

B2. The method of section B1, wherein the desired position is a desired depth inside the rack.

B3. The method of section B2, wherein at the desired depth inside the rack one or more rack connectors connect with one or more equipment connectors.

B4. The method of section B3, wherein the one or more rack connectors and the one or more equipment connectors are one or more of a power connector, cooling connector, an ethernet connector, a USB connector, and a bus connector.

B5. The method of section B1, wherein said locking an equipment to a rack takes place without user input.

B6. The method of section B1 and B3, wherein the equipment is one of a server, a storage device, a router, a switch, a hub, or a bridge.

B7. The method of section B6, wherein said equipment is powered without readjusting a position of the equipment.

B8. The method of section B6, wherein the equipment is cooled down without readjusting a position of the equipment.

B9. The method of section B6, wherein the equipment is communicating with one or more of another equipment and the Internet without readjusting a position of the equipment.

B10. The method of section B6, wherein the equipment is ready to be booted up without readjusting a position of the equipment.

B11. The method of section B1, wherein the equipment is connected to an equipment locking mechanism and a trigger on an external surface of the equipment.

B12. The method of section B11, wherein the equipment locking mechanism has an unlocked state and a locked state, and the trigger has a set state and a tripped state.

B13. The method of section B12, wherein the trigger is connected to the equipment locking mechanism such that in the set state the trigger retains the equipment locking mechanism in the unlocked state and such that as the trigger transitions from the set state to the tripped state the trigger transitions the equipment locking mechanism from the unlocked state to the locked state, at the desired position.

B14. The method of section B12 and B13, wherein at the desired position the trigger make a contact with at least a portion of the rack.

C1. An equipment locking device for locking an equipment within a rack, comprising:
a rack locking mechanism;
an equipment locking mechanism having an unlocked state and a locked state, and
a trigger connected to the equipment locking mechanism such that upon the trigger contacting a portion of the rack, the trigger automatically transitions the equipment locking mechanism from the unlocked state to the locked state, wherein the equipment locking mechanism in the locked state engage with the rack locking mechanism.

C2. The equipment locking device of section C1, wherein the trigger is movable between a set state and a tripped state.

C3. The equipment locking device of section C2, wherein at the set state the trigger retains the equipment locking mechanism in the unlocked state and as the trigger transitions from the set state to the tripped state the trigger transitions the equipment locking mechanism from the unlocked state to the locked state.

C4. The equipment locking device of section C1, wherein the equipment is one of a server, a storage device, a router, a switch, a hub, or a bridge.

C5. The equipment locking device of section C1, wherein the equipment locking mechanism is connected to a housing of the equipment.

C6. The equipment locking device of section C1, further including two or more equipment locking mechanisms connected to a housing of the equipment.

C7. The equipment locking device of section C2, wherein the trigger is biased away from the equipment via a trigger biasing member when the trigger is in the set state.

C8. The equipment locking device of section C7, wherein the trigger biasing member is a spring.

C9. The equipment locking device of section C2, wherein the trigger rigidly protrudes out of the equipment when the trigger is in the set state.

C10. The equipment locking device of section C2, wherein the trigger is pushed inside of the equipment when the trigger is in the tripped state.

C11. The equipment locking device of section C2, wherein the trigger is pushed sideways along an equipment surface when the trigger transitions from the set state to the tripped state.

C12. The equipment locking device of section C2, wherein the trigger is pushed against an outer surface of the equipment when the trigger transitions from the set state to the tripped state.

C13. The equipment locking device of section C2, wherein the equipment locking mechanism includes a passage and a passage cover.

C14. The equipment locking device of section C13, wherein the passage cover is positioned at a passage opening when the equipment locking mechanism is in the unlocked state.

C15. The equipment locking device of section C13, wherein the trigger moves the passage cover away from a passage opening when the trigger transitions from the set state to the tripped state and when the equipment locking mechanism transitions from the unlocked state to the locked state.

C16. The equipment locking device of section C15, wherein the trigger is connected via a switch to the passage cover.

C17. The equipment locking device of section C15, wherein the trigger is connected via a switch to the passage cover.

C18. The equipment locking device of section C15, wherein the trigger is electronically connected to the passage cover.

C19. The equipment locking device of section C15, wherein the trigger is magnetically connected to the passage cover.

C20. The equipment locking device of section C15, wherein the trigger is mechanically coupled with the passage cover.

C21. The equipment locking device of section C15, wherein the trigger is wirelessly connected to the passage cover.

C22. The equipment locking device of section C15, wherein the passage cover transitions from a top of the passage opening to a bottom of the passage when the equipment locking mechanism transitions from the unlocked state to the locked state.

C23. The equipment locking device of section C15, wherein the passage cover transitions from a top of the passage opening to a side wall of the passage via a hinge when the equipment locking mechanism transitions from the unlocked state to the locked state.

C24. The equipment locking device of section C15, wherein the passage cover transitions from a top of the passage opening to a side of the passage opening when the equipment locking mechanism transitions from the unlocked state to the locked state.

C25. The equipment locking device of section C2, wherein the rack locking mechanism is an auto-ejector.

C26. The equipment locking device of section C25, wherein the auto-ejector is biased towards the equipment via an auto-ejector biasing member.

C27. The equipment locking device of section C26, wherein the auto-ejector biasing member is a spring.

C28. The equipment locking device of section C25, wherein the auto-ejector is configured to engage with the equipment locking mechanism to lock said equipment to the rack when the trigger transitions from the set state to the tripped state.

C29. The equipment locking device of section C2, wherein the rack includes one or more rack connectors.

C30. The equipment locking device of section C29, wherein the equipment includes one or more equipment connectors.

C31. The equipment locking device of section C30, wherein the one or more rack connectors are connected to the one or more equipment connectors when the trigger is transitioned from the set state to the tripped state and the trigger transitions the equipment locking mechanism from the unlocked state to the locked state.

C32. The equipment locking device of section C31, wherein the one or more rack connectors and the one or more equipment connectors are one or more of a power connector, cooling connector, an ethernet connector, a USB connector, and a bus connector.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. An equipment locking device for locking equipment within a rack, comprising:
   an equipment locking mechanism connected to the equipment, the equipment locking mechanism having an unlocked state and a locked state; and
   a trigger transitioning between a set state and a tripped state, the trigger connected to the equipment locking mechanism such that in the set state, the trigger retains the equipment locking mechanism in the unlocked state wherein a retraction bar is wedged into an auto-ejector that keeps the equipment locking mechanism unbiased relative to the rack and such that, as the trigger transitions from the set state to the tripped state, the trigger transitions the equipment locking mechanism from the unlocked state to the locked state upon contacting a portion of the rack wherein the retraction bar is unwedged from the auto-ejector allowing the equipment locking mechanism to become biased toward the locked state.

2. The equipment locking device of claim 1, wherein the equipment is one of a server, a storage device, a router, a switch, a hub, or a bridge.

3. The equipment locking device of claim 1, wherein the equipment locking mechanism is biased towards the locked state via a lock biasing member.

4. The equipment locking device of claim 1, further including the trigger rotating around an axis from the set state to the tripped state.

5. The equipment locking device of claim 1, wherein the trigger has a first end and a second end.

6. The equipment locking device of claim 5, wherein the second end of the trigger is configured to make a contact with the rack.

7. The equipment locking device of claim 1 wherein the trigger is lined up in parallel of a housing of the equipment.

8. The equipment locking device of claim 1, wherein the equipment locking mechanism further includes a retraction bar.

9. The equipment locking device of claim 1, wherein the rack includes one or more rack connectors and the equipment includes one or more equipment connectors.

10. The equipment locking device of claim 9, wherein the one or more rack connectors are connected to the one or more equipment connectors when the trigger is transitioned from the set state to the tripped state and the trigger transitions the equipment locking mechanism from the unlocked state to the locked state.

11. A method for locking an equipment to a rack, comprising:
   sliding the equipment of claim 1 inside the rack; and
   upon the equipment reaching a desired position within the rack, automatically locking the equipment to the rack by:
      engaging the trigger of claim 1 within the equipment that unwedges the retraction bar of claim 1 from the auto-ejector of claim 1 within an equipment locking mechanism of claim 1 causing the equipment locking mechanism to become biased toward the rack locking the equipment into the rack.

12. The method of claim 11, wherein the desired position is a desired depth inside the rack.

13. The method of claim 12, wherein at the desired depth inside the rack one or more rack connectors connect with one or more equipment connectors.

14. The method of claim 13, wherein the one or more rack connectors and the one or more equipment connectors are one or more of a power connector, cooling connector, an ethernet connector, a USB connector, and a bus connector.

15. An equipment locking device for locking an equipment within a rack, comprising:
   an auto-ejector;
   an equipment locking mechanism having an unlocked state and a locked state, and
   a trigger connected to the equipment locking mechanism such that upon the trigger contacting a portion of the rack, the trigger automatically transitions the equipment locking mechanism from the unlocked state to the locked state,
   wherein a retraction bar is wedged into the auto-ejector such that the retraction bar keeps the equipment locking mechanism in the unlocked state and wherein the retraction bar is unwedged from the auto-ejector allowing the equipment locking mechanism to become biased toward the locked state.

16. The equipment locking device of claim 15, wherein the trigger is movable between a set state and a tripped state.

17. The equipment locking device of claim 16, wherein the equipment locking mechanism includes a passage and a passage cover.

18. The equipment locking device of claim 17, wherein the passage cover is positioned at a passage opening when the equipment locking mechanism is in the unlocked state, and wherein the trigger moves the passage cover away from a passage opening when the trigger transitions from the set state to the tripped state and when the equipment locking mechanism transitions from the unlocked state to the locked state.

19. The equipment locking device of claim 16, wherein the auto-ejector is a rack locking mechanism.

20. The equipment locking device of claim 19, wherein the auto-ejector is configured to engage with the equipment locking mechanism to lock said equipment to the rack when the trigger transitions from the set state to the tripped state.

\* \* \* \* \*